(12) United States Patent
Hsieh et al.

(10) Patent No.: US 10,622,389 B2
(45) Date of Patent: Apr. 14, 2020

(54) IMAGE SENSOR

(71) Applicant: HIMAX TECHNOLOGIES LIMITED, Tainan (TW)

(72) Inventors: Yu-Jui Hsieh, Tainan (TW); Po-Nan Chen, Tainan (TW)

(73) Assignee: HIMAX TECHNOLOGIES LIMITED, Tainan (TW)

( * ) Notice: Subject to any disclaimer, the term of this patent is extended or adjusted under 35 U.S.C. 154(b) by 474 days.

(21) Appl. No.: 15/261,874

(22) Filed: Sep. 10, 2016

(65) Prior Publication Data

US 2018/0076242 A1 Mar. 15, 2018

(51) Int. Cl.
| | |
|---|---|
| *H01L 31/062* | (2012.01) |
| *H01L 27/146* | (2006.01) |
| *H01L 27/144* | (2006.01) |
| *H04N 5/33* | (2006.01) |
| *H01L 27/14* | (2006.01) |

(52) U.S. Cl.
CPC ............ *H01L 27/146* (2013.01); *H01L 27/14* (2013.01); *H01L 27/1443* (2013.01); *H01L 27/1464* (2013.01); *H01L 27/14621* (2013.01); *H01L 27/14625* (2013.01); *H01L 27/14627* (2013.01); *H01L 27/14632* (2013.01); *H01L 27/14685* (2013.01); *H04N 5/332* (2013.01); *H01L 27/14645* (2013.01); *H01L 27/14649* (2013.01)

(58) Field of Classification Search
CPC ........... H01L 27/14621; H01L 27/1225; H01L 27/14627; H01L 27/14625; H01L 27/14645; H01L 27/124; H01L 27/1255; H01L 27/3244; H01L 27/1222; H01L 27/127; H01L 27/1462; H01L 27/14623; H01L 27/1464; H01L 27/1443; H01L 27/14649; H01L 27/14685; H01L 27/14632; H01L 27/14; H01L 27/146
USPC ............................ 257/52, 89, 432, 440, 458
See application file for complete search history.

(56) References Cited

U.S. PATENT DOCUMENTS

| | | | | |
|---|---|---|---|---|
| 2003/0227582 | A1* | 12/2003 | Yu | G02F 1/133603 349/61 |
| 2011/0310277 | A1 | 12/2011 | Imamura et al. | |
| 2012/0056073 | A1* | 3/2012 | Ahn | H01L 27/14609 250/208.1 |
| 2016/0099272 | A1* | 4/2016 | Wang | H01L 27/14621 257/435 |

\* cited by examiner

*Primary Examiner* — Shouxiang Hu
(74) *Attorney, Agent, or Firm* — CKC & Partners Co., LLC

(57) ABSTRACT

An image sensor is provided. The image sensor includes a visible light receiving portion and an infrared receiving portion. The visible light receiving portion is configured to receive a visible light. The visible light receiving portion includes a first white filter. The infrared receiving portion is configured to receive infrared. The infrared receiving portion includes an infrared photodiode, a second white filter, and an infrared pass filter. The second white filter is disposed on the infrared photodiode. The infrared pass filter is disposed on the infrared photodiode. The infrared is received by the infrared photodiode after passing through the second white filter and the infrared pass filter.

12 Claims, 4 Drawing Sheets

IMAGE SENSOR

BACKGROUND

Field of Invention

The present invention relates to an image sensor. More particularly, the present invention relates to an image sensor having infrared sensing function.

Description of Related Art

With the development of the access control systems and security systems, the biometric technologies using human characteristics to confirm personal identity becomes prevalent. Iris recognition technology is a popular one of the biometric technologies since the iris recognition technology has high reliability. When the iris recognition technology is applied in an electronic device, such as a smart phone, an image sensor capable of receiving visible light and infrared separately is required to implement iris recognition function. A conventional image sensor has two different portions for receiving visible light and infrared separately.

SUMMARY

The present invention provides an image sensor. The image sensor includes a visible light receiving portion and an infrared receiving portion. The visible light receiving portion is configured to receive a visible light. The visible light receiving portion includes a first white filter. The infrared receiving portion is configured to receive infrared. The infrared receiving portion includes an infrared photodiode, a second white filter, and an infrared pass filter. The second white filter is disposed on the infrared photodiode. The infrared pass filter is disposed on the infrared photodiode. The infrared is received by the infrared photodiode after passing through the second white filter and the infrared pass filter.

BRIEF DESCRIPTION OF THE DRAWINGS

The invention can be more fully understood by reading the following detailed description of the embodiment, with reference made to the accompanying drawings as follows.

DETAILED DESCRIPTION

Specific embodiments of the present invention are further described in detail below with reference to the accompanying drawings, however, the embodiments described are not intended to limit the present invention and it is not intended for the description of operation to limit the order of implementation. Moreover, any device with equivalent functions that is produced from a structure formed by a recombination of elements shall fall within the scope of the present invention. Additionally, the drawings are only illustrative and are not drawn to actual size.

Figure 1:
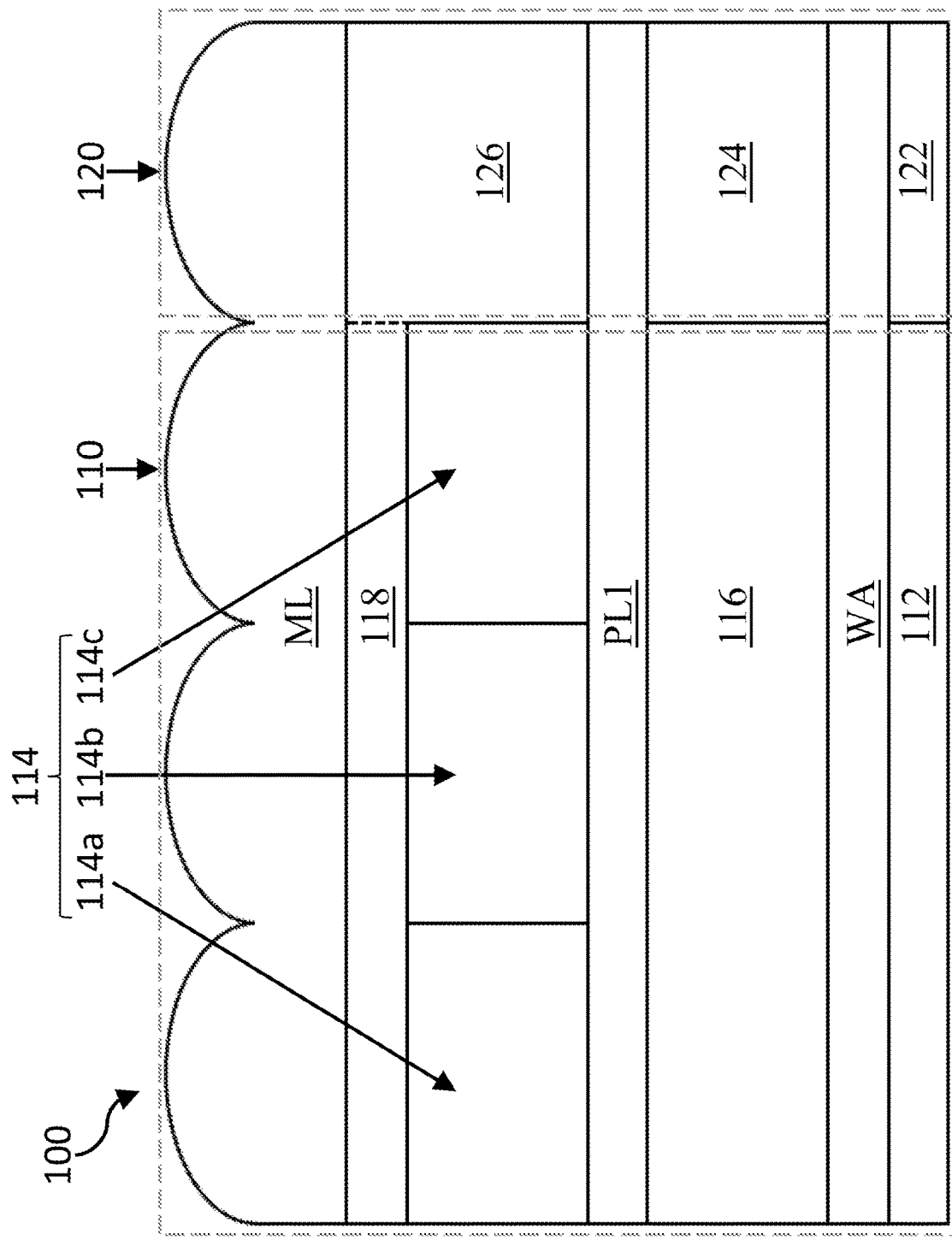
FIG. 1 is a cross-sectional view of an image sensor according to a first embodiment of the present invention.

FIG. 1 is a cross-sectional view of an image sensor 100 according to a first embodiment of the present invention. As shown in FIG. 1, the image sensor 100 includes a visible light receiving portion 110 and an infrared receiving portion 120. The visible light receiving portion 110 is configured to receive a visible light, and the infrared receiving portion 120 is configured to receive infrared.

As shown in FIG. 1, the visible light receiving portion 110 includes a visible light sensing layer 112, a color filter 114, an infrared cutoff filter 116 and a first white filter 118. The color filter 114, the infrared cutoff filter 116 and the first white filter 118 are disposed on the visible light sensing layer 112 to provide color light to the visible light sensing layer 112, and the visible light sensing layer 112 is configured to receive the visible light to generate main image signals accordingly. In this embodiment, the visible light sensing layer 112 includes at least one photodiode for sensing the color light, and the photodiode may be a complementary metal oxide semiconductor (CMOS) diode. However, embodiments of the present invention are not limited thereto.

The color filter 114 is configured to provide the color light. In this embodiment, the color filter 114 includes a red color filter unit 114a, a blue color filter unit 114b and a green color filter unit 114c, but embodiments of the present invention are not limited thereto. The infrared cutoff filter 116 is configured to cutoff infrared. In other words, the infrared cutoff filter 116 can block the transmission of the infrared, while passing the color light. In this embodiment, the infrared cutoff filter 116 blocks lights having a wavelength greater than 850 nm, but embodiments of the present invention are not limited thereto. Further, in this embodiment, the infrared cutoff filter 116 is disposed between the color filter 114 and the visible light sensing layer 112, but embodiments of the present invention are not limited thereto.

The first white filter 118 is configured to allow the passage of the color light. In this embedment, the first white filter 118 is a white photoresist, but embodiments of the present invention are not limited thereto. Further, in this embodiment, the color filter 114 is disposed between the first white filter 118 and the infrared cutoff filter 116, but embodiments of the present invention are not limited thereto.

As shown in FIG. 1, the infrared receiving portion 120 includes an infrared sensing layer 122, a second white filter 126 and an infrared pass filter 124. The second white filter 126 and the infrared pass filter 124 are disposed on the infrared sensing layer 122 to provide the infrared to the infrared sensing layer 122, and the infrared sensing layer 122 is configured to receive the infrared to generate auxiliary image signals accordingly. In this embodiment, the infrared sensing layer 122 includes at least one photodiode for sensing the infrared, and the photodiode may be a CMOS diode. However, embodiments of the present invention are not limited thereto.

The infrared pass filter 124 is configured to cutoff the visible light. In other words, the infrared pass filter 124 can block the transmission of the visible light, while passing the light. In this embodiment, the infrared pass filter 124 blocks lights having a wavelength smaller than 850 nm, but embodiments of the present invention are not limited thereto. The second white filter 126 is configured to allow the passage of the infrared. In this embedment, the second white filter 126 is a white photoresist, but embodiments of the present invention are not limited thereto. Further, in this embodiment, the infrared pass filter 124 is disposed between the second white filter 126 and the infrared sensing layer 122, but embodiments of the present invention are not limited thereto.

As shown in FIG. 1, the visible light receiving portion 110 and the infrared receiving portion 120 further include a wafer WA, a planarization layer PL1 and a micro-lens layer ML. The wafer WA is formed on the visible light sensing layer 112 and the infrared sensing layer 122 to provide a substrate on which the infrared cutoff filter 116 and the infrared pass filter 124 are disposed. In this embodiment, the wafer WA is a glass wafer, but embodiments of the present invention are not limited thereto.

The planarization layer PL1 is formed on the infrared cutoff filter 116 and the infrared pass filter 124 to provide a flat surface on which the color filter 114 and the second white filter 126 are disposed. The planarization layer PL1 also provides a good interface to help the color filter 114 and the second white filter 126 to be attached on the planarization layer PL1. It is noted that a thickness of the infrared cutoff filter 116 is substantially equal to that of the infrared pass filter 124 in this embodiment.

The micro-lens layer ML is formed on the first white filter 118 and the second white filter 126 to collect the infrared and the visible light. It is noted that a sum of a thickness of the color filter 114 and a thickness of the first white filter 118 is substantially equal to a thickness of the second white filter 126 in this embodiment. Specifically, when the image sensor 100 is used to sense an object (for example iris), the object is focused though the micro-lens layer ML. Further, focus of the image sensor 100 can be adjusted by varying a thickness of the micro-lens layer ML.

It is noted that the material of the micro-lens layer ML may be epoxy, optical cement, polymethylmethacrylates (PMMAs), polyurethanes (PUs), polydimethylsiloxane (PDMS), or other thermal curing or photo-curing transparent materials, but the present invention is not limited thereto.

The light path of the infrared received by the infrared sensing layer 122 extends from the micro-lens layer ML through the second white filter 126, the planarization layer PL1, and the infrared pass filter 124. In comparison with the conventional image sensor, the infrared received by the image sensor 100 has a smaller loss of intensity since the second white filter 126 is disposed in the infrared receiving portion 120 to achieve a decrease of the light path of the infrared. Therefore, the infrared received by the image sensor 100 has a better intensity to meet a user's demand.

It is noted that the first white filter 118 and the second white filter 126 are substantially formed in a process step by coating. For example, the first white filter 118 and the second white filter 126 are formed by coating a material of white photoresist on the planarization layer PL1 and the color filter 114, and thus the first white filter 118 and the second white filter 126 are formed in one-piece on the planarization layer PL1 and the color filter 114. Therefore, one skilled in the art will realize that the image sensor 100 has lower manufacturing costs than the conventional image sensor.

Figure 2:
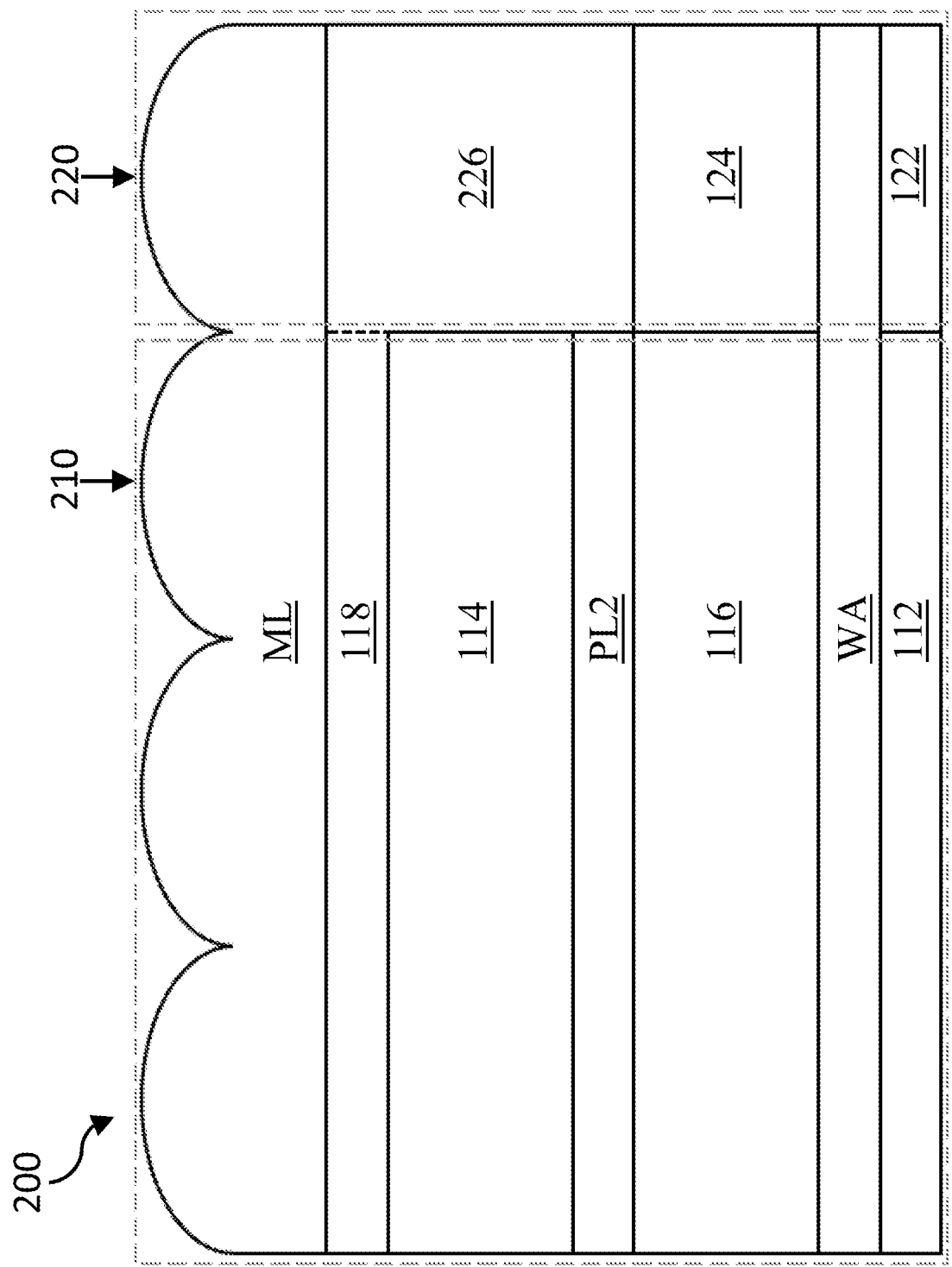
FIG. 2 is a cross-sectional view of an image sensor according to a second embodiment of the present invention.

FIG. 2 is a cross-sectional view of an image sensor 200 according to a second embodiment of the present invention. The image sensor 200 includes a visible light receiving portion 210 and an infrared receiving portion 220, in which the visible light receiving portion 210 includes a planarization layer PL2 and the infrared receiving portion 220 includes a second white filter 226. It is noted that the planarization layer PL2 and the second white filter 226 are similar to the planarization layer PL1 and the second white filter 126 respectively. The structure of the image sensor 200 is similar to the structure of the image sensor 100 except that the planarization layer PL2 is only located in the visible light receiving portion 210.

It is noted that a sum of a thickness of the first white filter 118, a thickness of the color filter 114 and a thickness of the planarization layer PL2 is substantially equal to a thickness of the second white filter 226 in this embodiment. Similar to the image sensor 100, the infrared received by the image sensor 200 has a better intensity to meet a user's demand and the image sensor 200 has lower manufacturing costs.

Figure 3:
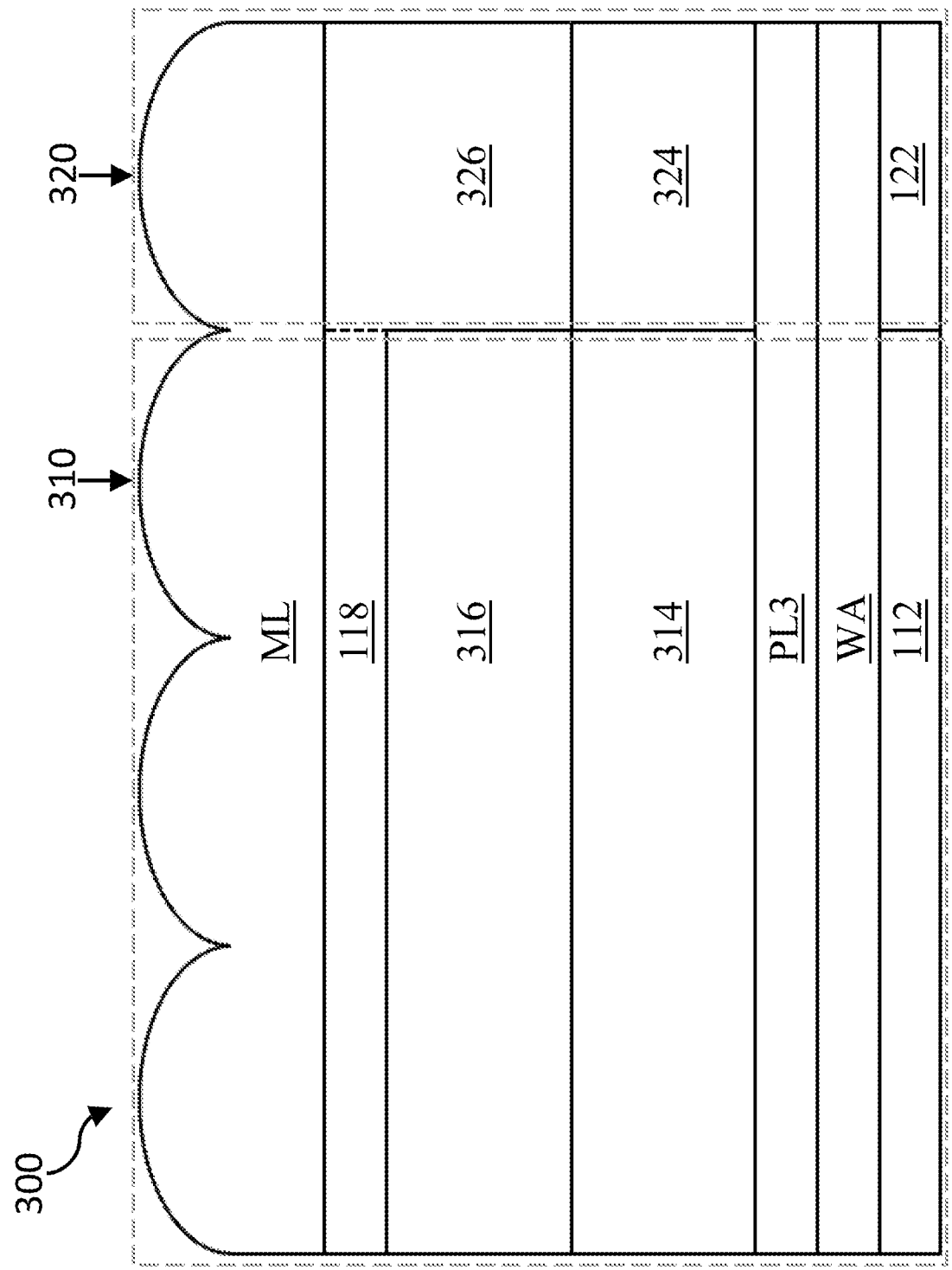
FIG. 3 is a cross-sectional view of an image sensor according to a third embodiment of the present invention.

FIG. 3 is a cross-sectional view of an image sensor 300 according to a third embodiment of the present invention. The image sensor 300 includes a visible light receiving portion 310 and an infrared receiving portion 320, in which the visible light receiving portion 310 includes a planarization layer PL3, a color filter 314 and an infrared cutoff filter 316 and the infrared receiving portion 320 includes the planarization layer PL3, an infrared pass filter 324 and a second white filter 326. It is noted that the planarization layer PL3, the color filter 314, the infrared cutoff filter 316, the infrared pass filter 324 and the second white filter 326 are similar to the planarization layer PL1, the color filter 114, the infrared cutoff filter 116, the infrared pass filter 124 and the second white filter 126 respectively. The structure of the image sensor 300 is similar to the structure of the image sensor 100, except that the color filter 314 is located between the infrared cutoff filter 316 and the planarization layer PL3.

It is noted that a thickness of the color filter 314 is substantially equal to that of the infrared pass filter 324 in this embodiment, and a sum of a thickness of the infrared cutoff filter 316 and a thickness of the first white filter 118 is substantially equal to a thickness of the second white filter 326 in this embodiment. Similar to the image sensor 100, the infrared received by the image sensor 300 has a better intensity to meet a user's demand and the image sensor 300 has lower manufacturing costs.

Figure 4:
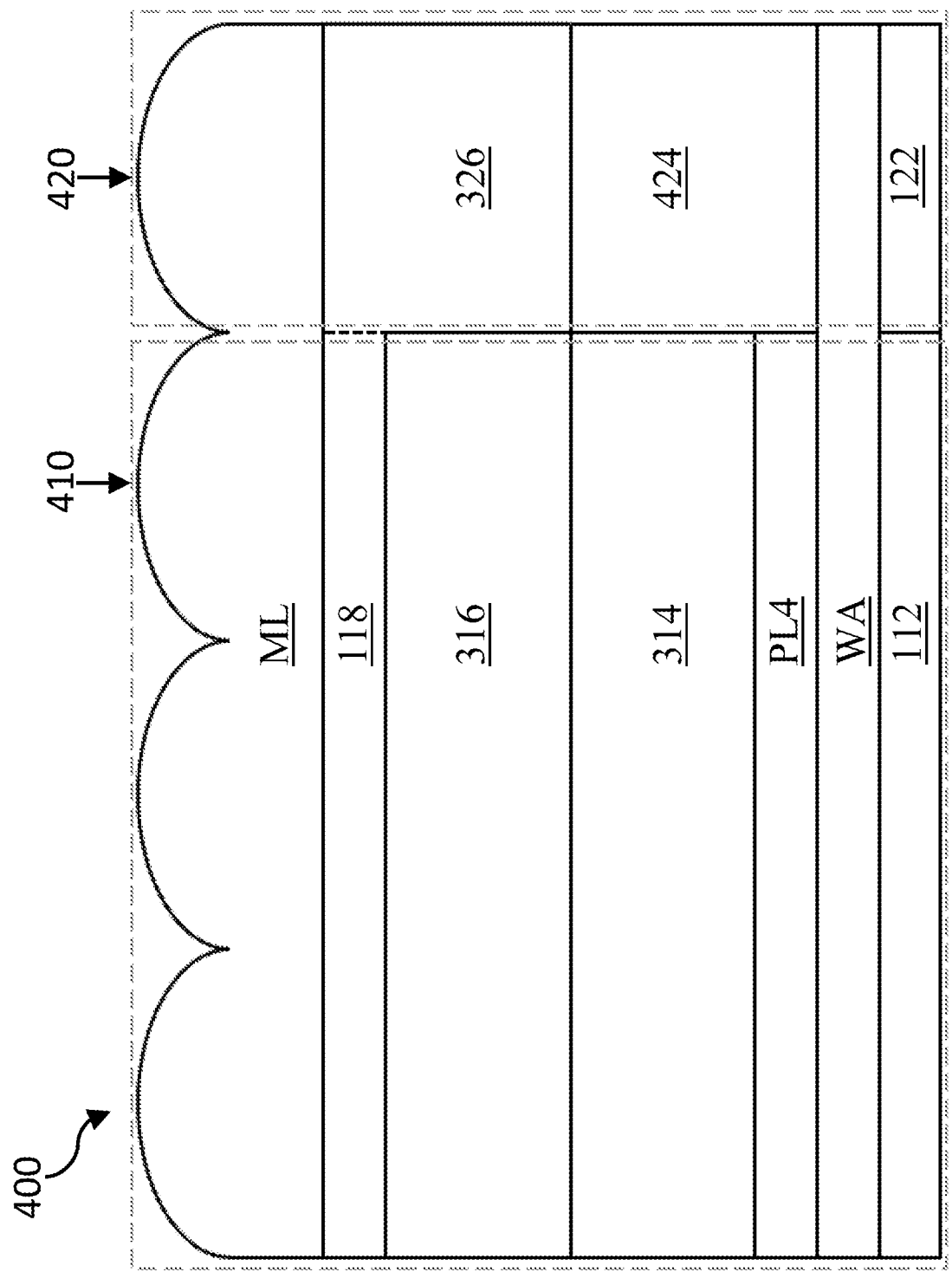
FIG. 4 is a cross-sectional view of an image sensor according to a fourth embodiment of the present invention.

FIG. 4 is a cross-sectional view of an image sensor 400 according to a fourth embodiment of the present invention. The image sensor 400 includes a visible light receiving portion 410 and an infrared receiving portion 420, in which the visible light receiving portion 410 includes a planarization layer PL4 and the infrared receiving portion 420 includes an infrared pass filter 424. It is noted that the planarization layer PL4 and the infrared pass filter 424 are similar to the planarization layer PL1 and the infrared pass filter 124 respectively. The structure of the image sensor 400 is similar to the structure of the image sensor 300, except that the planarization layer PL4 is only located in the visible light receiving portion 410.

It is noted that a sum of a thickness of the color filter 314 and the planarization layer PL4 is substantially equal to a thickness of the infrared pass filter 424 in this embodiment. Similar to the image sensor 300, the infrared received by the image sensor 400 has a better intensity to meet a user's demand and the image sensor 400 has lower manufacturing costs.

As can be understood from the above description, the structure of the image sensor of the present invention may effectively improve the intensity of the infrared received by the image sensor to meet a user's demand, thereby reducing the difficulty of follow-up analysis of the optical signal (for example image signal) on other instruments. Furthermore, the structure of the image sensor of the present invention may reduce the manufacturing costs.

Although the present invention has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An image sensor, comprising:
a visible light receiving portion configured to receive a visible light, wherein the visible light receiving portion comprises:
a visible light photodiode;
a color filter disposed on the visible light photodiode;
an infrared cutoff filter on the visible light photodiode and configured to cutoff infrared; and
a first white filter disposed on the color filter and the Infrared cutoff filter, wherein the color filter is located between the first white filter and the infrared cutoff filter;
an infrared receiving portion configured to receive the infrared, wherein the infrared receiving portion comprises:
an infrared photodiode;
a second white filter disposed on the infrared photodiode; and an infrared pass filter disposed on the infrared photodiode and configured to cutoff the visible light;
wherein the infrared is received by the infrared photodiode after passing through the second white filter and the infrared pass filter;
wherein each of the first white filter and the second white filter is a white photoresist and is configured to allow passage of light;
wherein the second white filter has a thickness substantially equal to a sum of a thickness of the first white filter and a thickness of the color filter; and
wherein a planarization layer is located between the color filter and the infrared cutoff filter and between the second white filter and the infrared pass filter.

2. The image sensor of claim 1, wherein the visible light is received by the visible light photodiode after passing through the first white filter, the color filter, and the infrared cutoff filter.

3. The image sensor of claim 2, wherein the color filter comprises a red color filter unit, a green color filter unit, and a blue color filter unit.

4. The image sensor of claim 2, wherein a sum of the thickness of the first white filter, the thickness of the color filter, and a thickness of the planarization layer is substantially equal to a sum of the thickness of the second white filter and the thickness of the planarization layer.

5. The image sensor of claim 2, further comprising a wafer located on the visible light photodiode and the infrared photodiode, wherein a first portion of the wafer is located in the visible light receiving portion and a second portion of the wafer is located in the infrared receiving portion.

6. The image sensor of claim 5, wherein the infrared cutoff filter is located between the color filter and the visible light photodiode, and the first portion of the wafer is located between the infrared cutoff filter and the visible light photodiode.

7. The image sensor of claim 5, wherein the infrared pass filter is located between the second white filter and the infrared photodiode, and the second portion of the wafer is located between the infrared pass filter and the infrared photodiode.

8. The image sensor of claim 1, further comprising a micro-lens layer configured to collect the infrared and the visible light.

9. The image sensor of claim 8, wherein the micro-lens layer is located on the top of the image sensor.

10. The image sensor of claim 8, wherein the micro-lens layer is located in the visible light receiving portion and infrared receiving portion.

11. The image sensor of claim 1, wherein a combination of the first white filter and the second white filter is a monolithic structure.

12. The image sensor of claim 1, wherein the first white filter is disposed to be directly attached on the color filter.

* * * * *